United States Patent [19]
Bonnet et al.

[11] Patent Number: 5,153,504
[45] Date of Patent: Oct. 6, 1992

[54] PNEUMATICALLY ACTUATED HOLD DOWN GATE

[75] Inventors: Troy J. Bonnet; James H. Kirk, both of Georgetown, Tex.

[73] Assignee: International Business Machines Corporation, Armonk, N.Y.

[21] Appl. No.: 690,025

[22] Filed: Apr. 23, 1991

[51] Int. Cl.5 ............... G01R 1/06; G01R 31/02
[52] U.S. Cl. ............... 324/158 F; 324/158 P; 324/158 R
[58] Field of Search ........... 324/158 R, 158 F, 158 P, 324/72.5; 439/482, 824; 269/901, 903

[56] References Cited

U.S. PATENT DOCUMENTS

| | | | |
|---|---|---|---|
| 4,017,793 | 4/1977 | Haines | 324/73 PC |
| 4,099,120 | 7/1978 | Aksu | 324/158 P |
| 4,164,704 | 8/1978 | Kato et al. | 324/73 PC |
| 4,321,533 | 3/1982 | Matrone | 324/158 F |
| 4,344,033 | 8/1982 | Stowers et al. | 324/158 F |
| 4,357,062 | 11/1982 | Everett | 339/18 R |
| 4,357,575 | 11/1982 | Uren et al. | 324/158 F |
| 4,636,723 | 1/1987 | Coffin | 324/158 F |
| 4,730,159 | 3/1988 | Collins | 324/158 F |
| 4,758,785 | 7/1988 | Rath | 324/158 P |
| 4,771,234 | 9/1988 | Cook et al. | 324/158 F |
| 4,774,462 | 9/1988 | Black | 324/158 F |
| 4,812,754 | 3/1989 | Tracy et al. | 324/158 F |
| 4,818,933 | 4/1989 | Kerschner et al. | 324/158 F |
| 4,866,375 | 9/1989 | Malloy | 423/158 F |
| 4,912,400 | 3/1990 | Plante | 324/158 F |
| 4,962,356 | 10/1990 | Eberlein et al. | 324/158 F |
| 4,993,136 | 2/1991 | Kerschner et al. | 29/401.1 |
| 4,996,476 | 2/1991 | Balyasry et al. | 324/158 F |

OTHER PUBLICATIONS

IBM Technical Disclosure Bulletin, "Mass Termination Test Probe Fixture", vol. 21, No. 2, Jul. 1978, pp. 765-766.

*Primary Examiner*—Vinh Nguyen
*Attorney, Agent, or Firm*—Mark E. McBurney

[57] ABSTRACT

A hold down gate to be used in conjunction with a circuit board test device is provided and includes a stationary frame movably affixed to a probe plate, which is rigidly disposed on the probe surface of the test device. The stationary frame includes piston chambers therein and means for providing pressurized fluid to the chamber, and releasing the fluid from the chamber. Pistons, disposed in the chambers have one end which protrudes downwardly from the stationary frame and are rigidly affixed to the movable frame. The movable frame is sized to contact the perimeter of the circuit board being tested. Thus, when a cricuit board is placed on the probe plate the stationary frame is moved such that the movable frame is in abutting relation with the perimeter of the board. The stationary frame is then latched into place to prevent any further movement. Pressurized fluid is then provided to the piston chambers of the stationary frame, forcing the pistons in a downward direction. The movement of the pistons then cause the movable frame to move downwardly such that the circuit board is firmly and reliably seated on the test probes and electrical continuity between the electronic components on the board and the test equipment is provided.

12 Claims, 4 Drawing Sheets

PNEUMATICALLY ACTUATED HOLD DOWN GATE

BACKGROUND OF THE INVENTION

1. Field of the Invention

The present invention relates generally to testing of printed circuit boards for use in electronic products, such as computers, and the like. More specifically, a hold down gate is provided which uses a fluid actuated piston to firmly dispose a board being tested adjacent a test apparatus.

2. Description of Related Art

Apparatus for testing printed circuit boards and cards are well known in the art. For example the Hewlett-Packard SMT-Series 3065 and 3070 are commercially available and widely used in the industry. Most testers utilize a "bed-of-nails" design, which includes a probe surface having plural (thousands) of sockets that are interconnected to test equipment, such as a computer with the appropriate software. Test probes are insertable in these sockets and protrude upwardly from the probe surface. These probes are configured to match the input/output connection points of the electronic components, such as integrated circuits (ICs), resident on the circuit board being tested. Further, the probes are biased upwardly such that to ensure proper alignment, a card must be placed over the probes and sufficient downward force must be provided to such that proper electrical connection is made between the I/Os of the electronic components and the test equipment, via the biased test probes.

Conventional test apparatus utilize a vacuum system to provide the downward force necessary to properly seat the card, under test, over the probes. A frame and resilient seal are provided, the seal being disposed around the perimeter of the frame such that a cavity is formed by the underside of the card, the top side of the probe surface and the seal. This cavity is then evacuated, thereby forcing the card downwardly on to the test probes. Several problems exist by using the configuration of conventional test apparatus. For example, maintaining the seal such that sufficient force is provided to ensure proper contact between the card and probes requires frequent maintenance and costly down time often caused by the introduction of contaminants such as dust, bits of substrate material, grease, or the like. Additionally, each test probe requires approximately one half pound per square inch (0.5 lbs/in2) of force to ensure proper electrical connection. The high density printed circuit boards utilized by today's computers often have numerous electronic components and corresponding I/Os such that as many as 2,000, or more test probes are needed. Therefore, it can be seen that 1,000 pounds, or more of downward force may be required to properly seat the board being tested on the probes. These force requirements are not adequately and reliably met by utilization of a vacuum system of conventional test apparatus.

Vacuum systems for holding printed circuit boards adjacent a bed-of-nails type test apparatus are shown by U.S. Pat. Nos. 4,636,723; 4,771,234; 4,164,704; 4,321,533; 4,344,033; and 4,017,793, which also shows the utilization of positive air pressure acting against the PCB to force it into contact with the test equipment.

Further, U.S. Pat. Nos. 4,357,062 and 4,099,120 show expandable air bags for providing contact between test equipment and the components on printed circuit boards.

Threaded rods driven by a belt and stepper motor arrangement are used by U.S. Pat. Nos. 4,993,136 and 4,818,933 for biasing an upper probe plate against the surface of a printed circuit board being tested.

A piston assembly is used in U.S. Pat. No. 4,962,356 to apply uniform and controllable pressure to a single integrated circuit device. The pressure is applied to a carrier and in a direction normal to the IC, such that bending test socket pins and gouging IC leads is prevented.

U.S. Pat. No. 4,357,575 uses an external piston assembly to move a head and contact assembly between a standby and test positions for test of printed circuit boards.

U.S. Pat. No. 4,812,754 employs pistons in communication with a locking plate and platens to draw test heads into contact with a PCB. when the pistons are actuated.

Thus, it would be desirable to have a hold down, or gate which could reliably provide the force necessary to ensure proper connection of the electronic components of the board with the test equipment, and eliminate the costly down time associated with maintenance of a vacuum system, particularly the of resilient seals. Further, problems associated with fluid pressure bags, or diaphragms and rotating threaded rods will also be eliminated by the system of the present invention. Additionally, a much simpler and reliable piston arrangement is shown by the present invention for testing entire printed circuit boards and providing the required force to create and maintain proper electrical contact than is utilized by conventional PCB hold down techniques using pistons.

SUMMARY OF THE INVENTION

In contrast to the prior art, the present invention utilizes a fluid pressure actuated piston, contained in a stationary frame and affixed to a movable frame, to provide the downward force required to ensure the proper seating of the board, or card, being tested with the test probes.

Broadly, a stationary frame is movably affixed to a probe plate which is rigidly disposed on the probe surface of the test apparatus. The stationary frame includes piston chambers therein and means for providing pressurized fluid to the chamber and releasing the fluid therefrom. Pistons, disposed in the chambers have one end which protrudes downwardly from the stationary frame and are rigidly affixed to the movable frame. The movable frame is sized to contact the perimeter of the circuit board being tested. Thus, when a circuit board is placed on the probe plate the stationary frame is moved such that the movable frame is in abutting relation with the perimeter of the board. The stationary frame is then latched into place to prevent any further movement thereof. Pressurized fluid is then provided to the piston chambers of the stationary frame forcing the pistons in a downward direction. The movement of the pistons then cause the movable frame to move downwardly such that the circuit board is firmly and reliably seated on the test probes and electrical continuity between the electronic components on the board and the test equipment is provided.

In accordance with the previous summary, objects features and advantages of the present invention will become apparent to one skilled in the art from the subsequent description and the appended claims taken in conjunction with the accompanying drawings

DETAILED DESCRIPTION OF THE PREFERRED EMBODIMENTS

Figure 1:
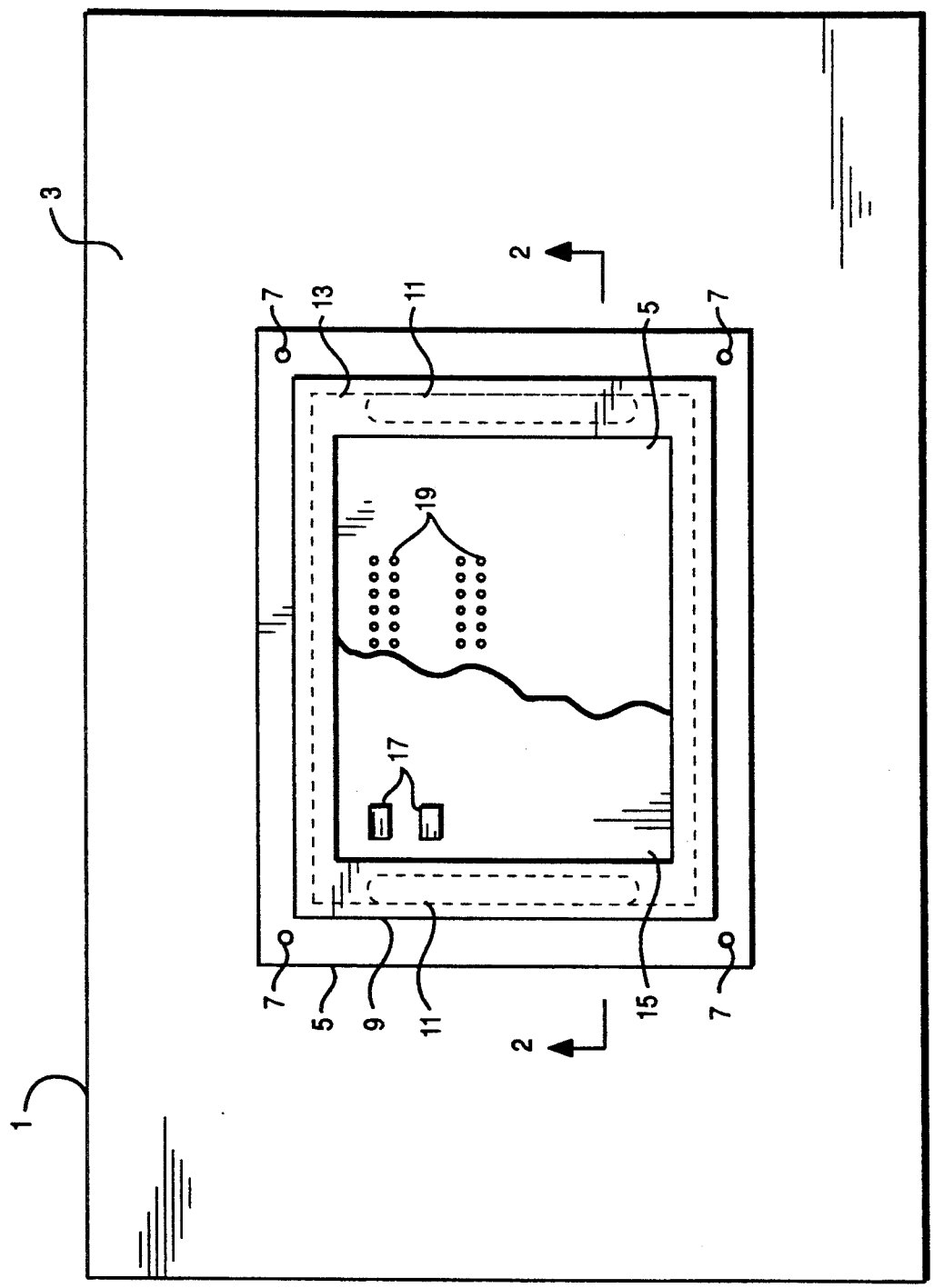
FIG. 1 is a plan view of the hold down gate of the present invention in conjunction with a bed-of-nails type test apparatus.

Referring to FIG. 1, a plan view of the present invention is shown wherein reference numeral 1 is a circuit card test apparatus such as the previously mentioned Hewlett-Packard SMT-Series 3070 which includes a probe surface 3 that is a "bed-of-nails" type configuration of electrical test contacts. A test probe template 5 is placed directly onto test probe surface 3 of test apparatus 1 and is constructed of any suitable electrically insulating material such as fiberglass plastic, or the like. Template 5 will provide support and alignment to test probes 19 and is created by drilling holes therethrough which correspond to the particular configuration of probes 19 being used. Probe template 5 is originally affixed to test apparatus 1 by engagement means 7 which are bolt and screw arrangements, or the like. Stationary frame 9 is shown in a latched position (to be described later in conjunction with FIGS. 3 and 4) and includes piston chamber 11 formed therein. A movable frame 13 is also shown and disposed intermediate stationary frame 9 and template 5, in a manner to be discussed below. A circuit board 15 to be tested is shown and is disposed intermediate movable frame 13 and template 5. Circuit board 15 includes a plurality of electronic components 17, such as connectors. ICs, microprocessors, memory chips, or the like which have input-/output contacts which protrude through circuit board 15. A portion of circuit board 15 is cut away revealing the top surface of template 5 and shows a plurality of test probes 19 extending through alignment holes 35 (FIG. 2) disposed within template 5. Probes 19 make electrical contact with the I/Os extending from electronic components 17 such that test equipment (not shown) can be connected to component 17.

Figure 2:
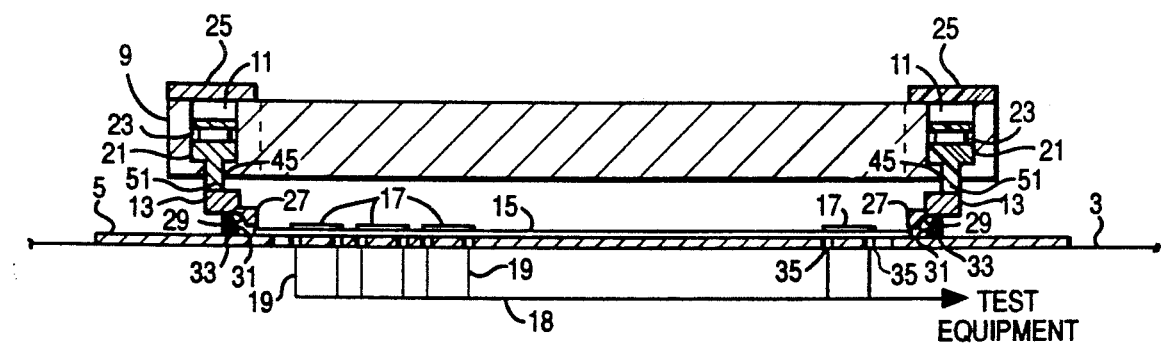
FIG. 2 is an crossectional elevation view of the hold down gate and test apparatus taken along line 2—2 of FIG. 1.

FIG. 2 is a front elevation view in cross section, take along line 2—2 of FIG. 1. Again, stationary frame 9 is shown having piston chambers 11 formed therein. Pistons 21 are shown disposed in chamber 11 and in a downwardly extended position. Piston 21 includes annular recess 23 around the perimeter thereof, such that a resilient sealing means, such as an o-ring, can be inserted therein to provide a sealing engagement when pressurized fluid, such as air, is introduced to chamber 11. The cover 25 is disposed above chamber 11 and affixed to frame 9 by conventional means such as screws, bolts, or the like. Additionally, cover 25 includes sealing means (not shown) for providing a sealing relation between cover 25 and frame 9. Moveable frame 13 is shown affixed to an end 51 of pistons 21 opposite annular recess 23. Frame 13 is rigidly affixed to pistons 21 in a conventional manner such that the motion of pistons 21 within chamber 11, responsive to the introduction of pressurized fluid, will cause movable frame 13 to be correspondingly disposed upwardly, or downwardly. Further, movable frame 13 is capable of withstanding the amount of force required to provide reliable electrical contact between probes 19 and the I/Os of the electrical components on circuit board 15. This force may be equal to 1000 pounds, or more, depending on the number of probes 19 required. Additionally, frame 13 includes extended portion 27 which physically contacts circuit board 15, thereby ensuring proper contact and reliable holding of circuit board 15 adjacent template 5 and probes 19. Extended portion 27 of movable frame 13 includes a bevel edge 29 which fits against a bevel edge 31 of guide 33 that is included in template 5. Guide 33 allows for proper alignment of circuit board 15 with template 5 and probes 19 such that an operator of the test apparatus of the present invention can conveniently and reliably align circuit board 15 with the proper test probes 19. Holes 35 are shown which have been drilled or otherwise formed in template 5 and allow electrical test probes 19 to protrude therethrough. Probes 19 are biased upwardly toward circuit board 15 and electrically connected to test equipment, such as a computer with appropriate test software, through wires 18.

Figure 3:
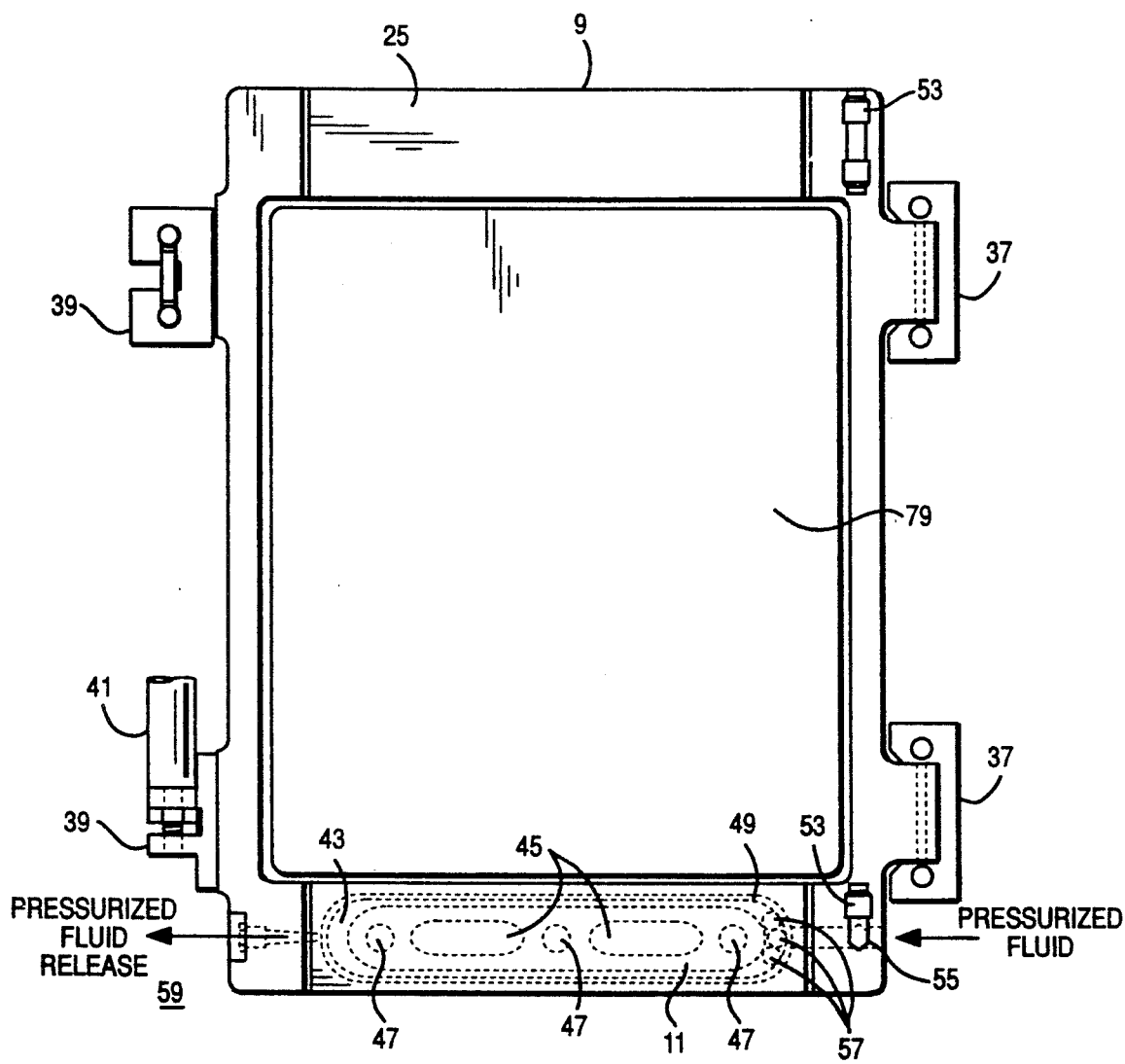
FIG. 3 is a plan view of the stationary frame of the present invention.

FIG. 3 is a detailed view of stationary frame 9 and shows hinges 37 which rigidly attach to probe surface 3 of test apparatus 1 by conventional means such as screws, bolts or the like. Further, latching means 39 are included which provide stationary frame 9 to be rigidly latched in a downward position such that support is provided for movable frame 13. Handle 41 is used to engage and/or disengage latching means 39 (see FIG. 4). Again, cover 25 is shown, as well as piston chamber 11 and a lip portion 43 formed around chamber 11 and interior to recess 49, which is disposed in frame 9 such that an o-ring seal, or the like can be placed therein to form the sealing relationship between cover 25 and frame 9. Lip 43 allows a thin cavity to be formed between the top of piston 21 and cover 25 such that pressurized fluid, such as air, or the like can be introduced therein to force piston 21 in a downward direction. Piston 21 includes attachment ends 51 (FIG. 2) which extends through frame 9 in order to engage movable frame 13. Cut out portions 45 accommodate attachment ends 51 of piston 21 to allow for this extension through stationary frame 9. Also, recesses 47 are formed in the bottom of chamber 11 such that biasing means (not shown) such as a spring, or the like can be disposed therein to bias piston 21 upwardly towards cover 25 prior to the introduction of pressurized fluid into chamber 11, and subsequent to the release of pressurized fluid therefrom. Valves 53 are utilized to regulate the introduction of pressurized fluid into chamber 11. A source of pressurized fluid (not shown) is affixed to channel 55 which is in communication with ports 57 such that pressurized fluid is provided to chamber 11. An exhaust port 59 is also provided which allows for the release of the pressure within chamber 11 upon completion of the testing process and the opening of a release valve in communication with port 59 (not shown).

Figure 4:
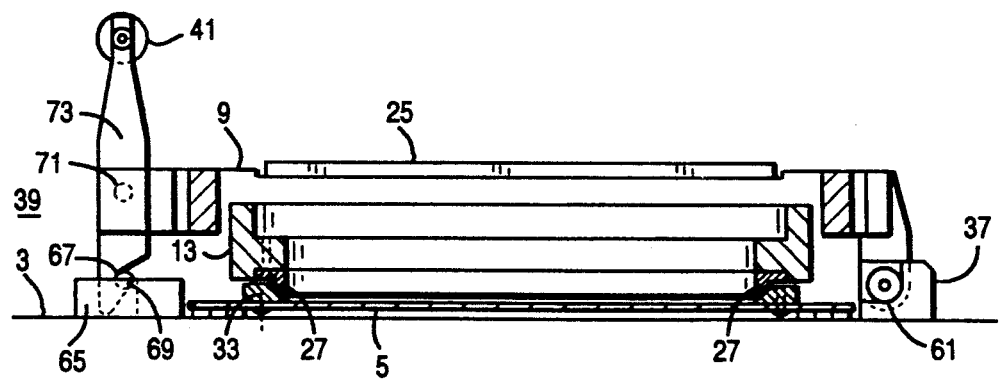
FIG. 4 is a side view of the hold down gate of the present invention including the stationary and movable frames, probe template and piston.

FIG. 4 is a side view of the present invention and illustrates the latching aspect of the stationary frame 9. Again, movable frame 13, stationary frame 9, cover 25, and template 5 are shown in the manner previously discussed. Additionally, hinge 37, includes pin 61 which allows stationary frame 9 to be rotatively moved thereabout. Latching means 39 is also shown and includes handle 41 and base portion 65, which is rigidly affixed to probe surface 3 of test apparatus 1. Base 65 includes a retainer pin 69. Latch 39 also includes pin 71 which allows member 73 to be rotated thereabout. Latch 39 also includes recess portion 67 in the end of member 73 opposite handle 41 which engages base pin 69 to rigidly affix stationary frame 9 to test apparatus 1 during the actual operation of the present invention.

Figure 5:
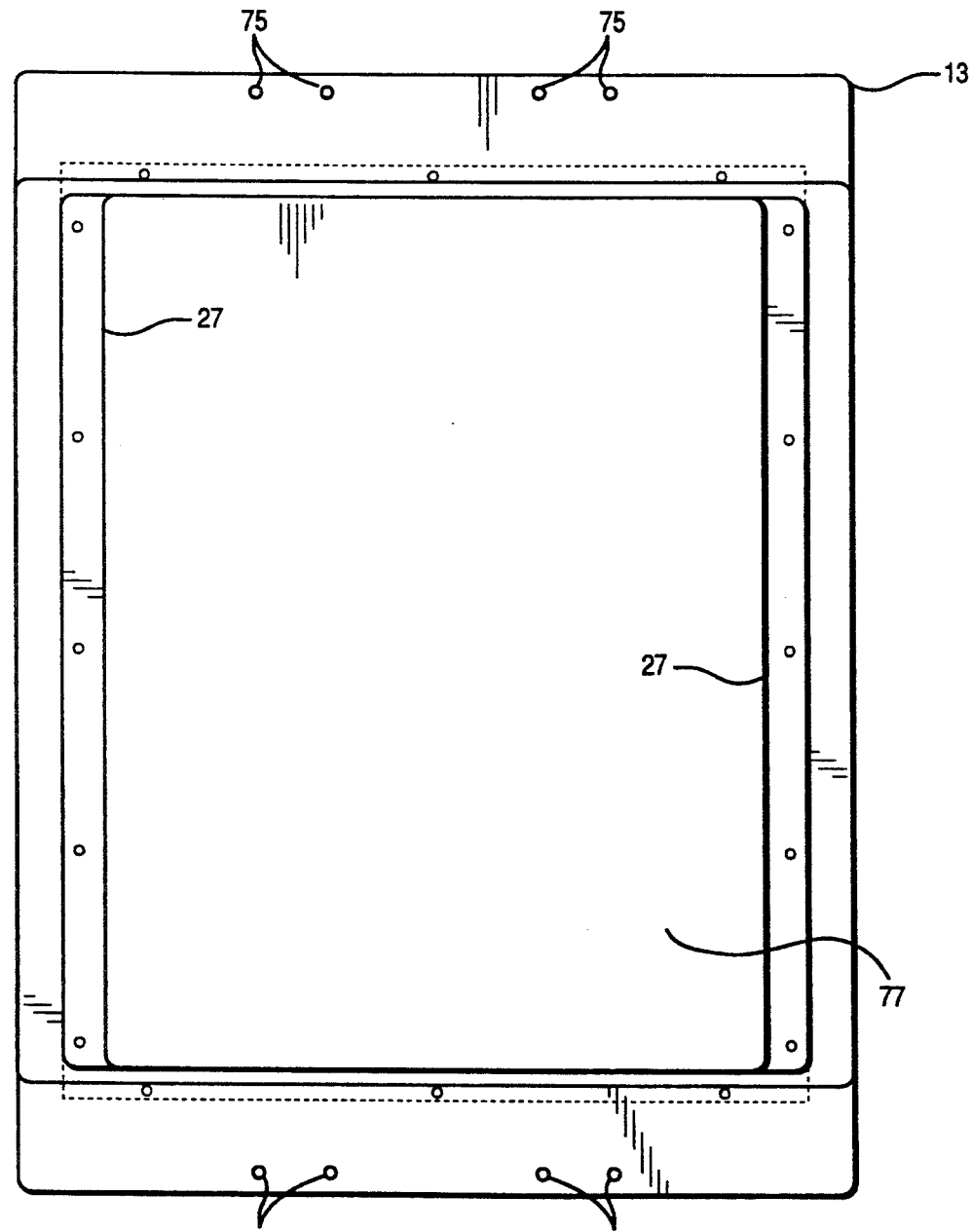
FIG. 5 is a plan view of the movable frame member of the present invention.

According to FIG. 5, movable frame 13 is shown with engagement portion 27 and holes 75 which are utilized to affix frame 13 to the extended portion 51 of piston 21 (see FIG. 2). It should be noted that the center portion 77 of movable frame 13 is open such that components 17 will not be contacted during the downward movement of frame 13 and no height limitation will be present that would allow only electrical components less than a predetermined height to be tested. Of course, stationary frame 9 also includes an open center as shown by reference numeral 79 (FIG. 3).

Figure 6:
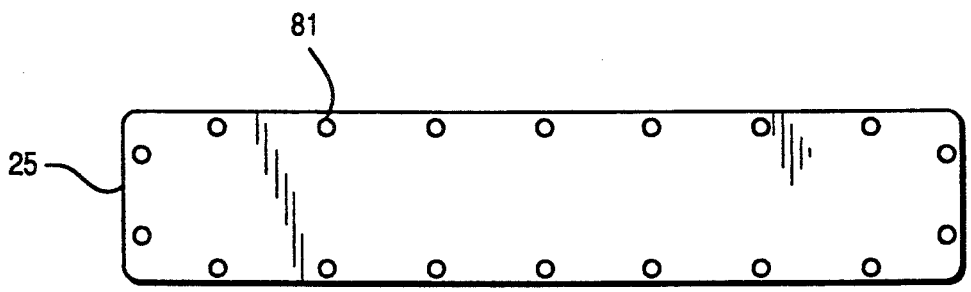
FIG. 6 illustrates a cover used to seal the piston chamber of the stationary frame.
Figure 7:
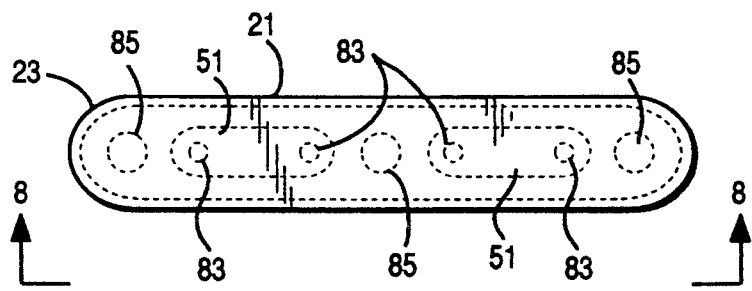
FIG. 7 is a top view of the piston of the present invention.
Figure 8:
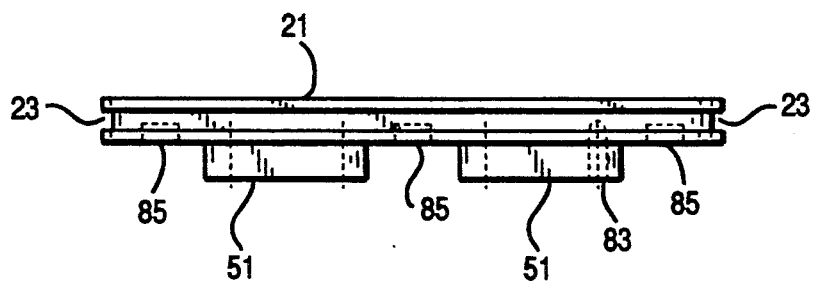
FIG. 8 is a side view of the piston taken along line 8—8 of FIG. 7.

FIG. 6 shows cover 25 which includes a plurality of holes 81 to allow for its attachments to stationary frame 9. FIG. 7 is a top view of piston 21. Annular recess 23 is shown (see also FIG. 2) which allows for the placement of an o-ring type seal therein. Spring recesses 85 are shown in piston 21 and correspond to recesses 47 formed in stationary frame 9 such that biasing means can be inserted therebetween and disposed in proper alignment to bias piston 21 upwardly when there is no pressurized fluid in chamber 11. Extended portion 51 of piston 21 is also shown and includes holes 83 which are preferably threaded to receive a bolt or screw in order to allow for the rigid affixation of movable frame 13 thereto. FIG. 8 then shows a side view of piston 21 taken along line 8—8 of FIG. 7. Again, annular recess 23 is shown for receiving an o-ring seal, or the like. Threaded hole 83 is disposed within extended portion 51 to allow for attachment of movable frame 13 thereto and recesses 85 are shown for allowing the proper disposition and alignment of biasing means (not shown) between piston 21 and recesses 47 of chamber 11 in stationary frame 9.

The operation of the present invention will now be described. An operator places a circuit board 15, having plural components thereon, onto template 5 by aligning board 15 with guides 33. In this manner, probes 19 will be aligned with the I/Os from components 17. Next, pressurized fluid is introduced into chambers 11, thereby forcing pistons 21 and movable frame 13 in a downwardly direction towards circuit board 15. It can be seen that the dimension of end portion 51 extending downwardly from piston 21 will correspond to the distance required for frame 13 to travel in order to contact board 15. Thus, while pressure is maintained in chambers 11, circuit board 15 is aligned with probes 19 and disposed thereagainst with sufficient force to reliably maintain electrical contact between the I/Os of components 17 and probes 19. Electrical testing is then performed by test apparatus, such as a computer system with the necessary software. Once testing is complete, pressure is released from chamber 11 and piston 21 is then biased upwardly by springs contained between recesses 47 and 85. The operator then removes the tested circuit board 15 by disengaging latch 39 and rotating the stationary and movable frame assembly about hinge 37. A new circuit board to be tested is then placed into template 5 and the process is repeated.

In summary, the present invention provides a fluid pressure actuated hold down mechanism for reliably aligning and providing sufficient pressure to a circuit board being tested in order ensure proper contact between the input/output contacts of the electronic components contained thereon and upwardly biased test probes which are connected to test equipment.

Although certain preferred embodiments have been shown and described, it should be understood that many changes and modifications may be made therein without departing from the scope of the appended claims.

What is claimed is:

1. An apparatus for seating a printed circuit board, having a plurality of electrical components thereon, on to a test device, comprising:
   at least one piston having an extended end portion for providing a force, greater than a predetermined force, required to seat said printed circuit board on to said test device;
   movable frame means having an open center portion, affixed to said extended end portion of said piston, for transferring said force directly to at least a portion of the perimeter of said printed circuit board; and
   stationary frame means, for supporting said piston and said movable frame means, including an open center portion corresponding to said movable frame means open center portion for receiving said electrical components, at least one sealed chamber for accommodating said piston and at least one aperture for allowing said extended end portion of said piston to protrude therethrough.

2. An apparatus according to claim 1 wherein said piston moves within said chamber responsive to the introduction of pressurized fluid thereto.

3. An apparatus according to claim 2 further comprising means disposed within said chamber adjacent said piston for biasing said piston away from said circuit board.

4. An apparatus according to claim 3 wherein said stationary frame means comprises:
   hinge means for providing the rotation of said stationary frame means and said affixed movable frame means thereabout; and
   latch means for releasably affixing said stationary frame means and said affixed movable frame onto said test device.

5. An apparatus according to claim 4 further comprising guide means for aligning said printed circuit board with said test device.

6. An apparatus according to claim 5 wherein said predetermined force is at least 1000 pounds.

7. An apparatus for testing electrical components, comprising:
   a printed circuit board having a plurality of said electrical components thereon;
   at least one piston with an extended end portion for providing a force, greater than a predetermined force, required to seat said printed circuit board on to said test device;

movable frame means having an open center portion, affixed to said extended end portion of said position, for transferring said force directly to at least a portion of the perimeter of said printed circuit board; and stationary frame means for supporting said piston and said movable frame means, including an open center portion corresponding to said movable frame means open center portion for receiving said electrical components, at least one sealed chamber for accommodating said piston and at least one aperture for allowing said extended end portion of said piston to protrude therethrough.

8. An apparatus according to claim 7 wherein said piston moves within said chamber responsive to the introduction of pressurized fluid thereto.

9. An apparatus according to claim 8 further comprising, means disposed within said chamber adjacent said piston for biasing said piston away from said circuit board.

10. An apparatus according to claim 9 wherein said stationary frame means comprises:

hinge means for providing the rotation of said stationary frame means and said affixed movable frame means thereabout; and latch means for releasably affixing said stationary frame means and said affixed movable frame onto said test device.

11. An apparatus according to claim 10 further comprising guide means for aligning said printed circuit board with said test device.

12. An apparatus according to claim 11 wherein said predetermined force is at least 1000 pounds.

* * * * *